(12) United States Patent
Devey et al.

(10) Patent No.: US 7,292,059 B2
(45) Date of Patent: Nov. 6, 2007

(54) POWER SUPPLY ASSEMBLY FOR A SEMICONDUCTOR CIRCUIT TESTER

(75) Inventors: William Devey, Beaverton, OR (US); Will A. Miller, Camas, WA (US); Anthony Delucco, Beaverton, OR (US)

(73) Assignee: Credence Systems Corporation, Milpitas, CA (US)

( * ) Notice: Subject to any disclaimer, the term of this patent is extended or adjusted under 35 U.S.C. 154(b) by 109 days.

(21) Appl. No.: 11/096,337

(22) Filed: Mar. 31, 2005

(65) Prior Publication Data

US 2006/0220671 A1   Oct. 5, 2006

(51) Int. Cl.
  *G01R 31/36* (2006.01)
(52) U.S. Cl. ........................................... 324/771
(58) Field of Classification Search ............... None
  See application file for complete search history.

(56) References Cited

U.S. PATENT DOCUMENTS

| | | | |
|---|---|---|---|
| 4,734,046 A | 3/1988 | McAllister et al. | 439/581 |
| 5,519,409 A * | 5/1996 | Uematsu et al. | 343/771 |
| 6,028,439 A | 2/2000 | Arkin et al. | 324/765 |
| 6,202,186 B1 | 3/2001 | Oonk | 714/738 |
| 6,476,628 B1 | 11/2002 | LeColst | 324/765 |
| 6,489,797 B1 | 12/2002 | MacDonald et al. | 324/765 |
| 6,768,650 B2 * | 7/2004 | Devey | 361/782 |
| 6,824,427 B1 | 11/2004 | Feldman et al. | 439/581 |
| 6,951,482 B1 * | 10/2005 | Miller et al. | 439/581 |
| 7,053,648 B2 * | 5/2006 | DeVey | 324/765 |
| 7,084,659 B2 * | 8/2006 | Delucco et al. | 324/765 |
| 2005/0194989 A1 * | 9/2005 | Delucco et al. | 324/765 |

\* cited by examiner

*Primary Examiner*—Jermele Hollington
(74) *Attorney, Agent, or Firm*—John Smith-Hill; Smith-Hill and Bedell

(57) ABSTRACT

A power supply assembly includes a dielectric substrate and a power supply circuit supported by the dielectric substrate. A conductive connection block is attached to the dielectric substrate at a main surface thereof and is connected to a power supply terminal of the power supply circuit. A spring probe pin is fitted in a bore formed in the connection block and includes a conductive sleeve and a conductive plunger fitted in the sleeve. The conductive sleeve is in electrically conductive contact with the connection block.

29 Claims, 6 Drawing Sheets

POWER SUPPLY ASSEMBLY FOR A SEMICONDUCTOR CIRCUIT TESTER

CROSS-REFERENCE TO RELATED APPLICATION

Subject matter disclosed in this application might be considered to be related to the subject matter disclosed in U.S. patent application Ser. No. 10/458,342 filed Jun. 9, 2003, U.S. patent application Ser. No. 10/802,993 filed Mar. 16, 2004, U.S. patent application Ser. Nos. 11/024,528 and 11/024,536, both filed Dec. 28, 2004, the entire disclosure of each of which is hereby incorporated by reference herein for all purposes.

BACKGROUND OF THE INVENTION

This invention relates to a power supply assembly for a semiconductor integrated circuit tester.

A conventional semiconductor integrated circuit tester that is used in conjunction with failure analysis equipment for probing the semiconductor material of an integrated circuit device while stimulating the device comprises a test head that interfaces to a device under test (DUT) through a device interface board (DIB) and pin electronics that transmit stimulus signals to and monitor response from the DUT. The tester also includes a device power supply that is connected to power supply pins of the DUT for supplying regulated DC voltage to the DUT for operating the DUT during the test.

Several trends in design and manufacture of integrated circuits influence the magnitude of the current drawn by an integrated circuit device. In particular, as advances in fabrication technologies allow integrated circuit devices to be made with smaller features, integrated circuits can be designed to include larger numbers of transistors. As the number of transistors increases, the power demands of the IC device will generally increase; and if the operating voltage of the IC device remains the same, the current drawn by the IC device will increase.

However, the reduction in size of features of IC devices allows the devices to operate at higher frequencies and as operating frequencies of integrated circuits increase, the operating voltage of the integrated circuits generally decreases. Consequently, the reduction in size of device features may lead to increase in current both because of an increase in the number of transistors and because of a reduction in operating voltage. Many testers are designed for concurrent testing of several IC devices. When an IC tester is to test concurrently several low voltage, high current IC devices, it must be able to provide a substantial amount of current to the devices under test.

A typical IC device including a large number of clocked gates draws a relatively high current during the first part of a clock cycle, when many transistors are actively switching, and a relatively low current during the latter part of the clock cycle, after the transistors have switched. Further, the amount of current drawn can vary from cycle to cycle depending mainly on how many transistors switch during each particular cycle.

In at least one known IC tester, the tester's device power supply is positioned remote from the test head and force and return terminals of the power supply are connected through cables to respective conductive power distribution blocks adjacent the DIB. Each power distribution block includes an array of spring probe pins (commonly known as pogo pins) that engage power supply contact pads of the DIB and the DIB includes conductive traces that connect the power supply contact pads to the power supply ($V_{cc}$ and ground) terminals of the DUT. In this known tester, there is a relatively long conductive path between the terminals of the device power supply and the VCC and ground terminals of the DUT, and these long conductive paths may have substantial inductance and resistance. The inductance and resistance of the power supply path results in a change in voltage drop across the path impedance when the current supplied to the DUT changes, and this change in voltage drop results in a change in voltage between the $V_{cc}$ and ground terminals of the DUT. Changes in operating voltage between the power supply terminals of the DUT must be kept within specified limits in order for the DUT to operate properly. As the operating voltage of ICs decreases, acceptable variations in operating voltage also decrease.

One way to reduce the magnitude of variation in power supply voltage is to connect voltage regulating capacitors to the power supply lines at a location as close as possible to the DUT. However, as the demand for current increases and the tolerance for variation in power supply voltage decreases, the capacitors that are needed to provide the necessary voltage regulation become impractically large.

SUMMARY OF THE INVENTION

In accordance with a first aspect of the invention there is provided a power supply assembly comprising a dielectric substrate having first and second opposite main surfaces, a power supply circuit supported by the dielectric substrate and having first and second power supply terminals, a first conductive connection block attached to the dielectric substrate at the first main surface thereof and connected to the first power supply terminal of the power supply circuit, the first connection block being formed with a bore, and a spring probe pin fitted in the bore formed in the connection block, and wherein the spring probe pin includes a conductive sleeve and a conductive plunger fitted in the sleeve and the conductive sleeve is in electrically conductive contact with the first connection block.

In accordance with a second aspect of the invention there is provided a power supply assembly comprising a dielectric substrate having first and second opposite main surfaces, a power supply circuit supported by the dielectric substrate and having first and second power supply terminals, first and second conductive connection blocks attached to the dielectric substrate at the first and second main surfaces respectively and connected to the first and second power supply terminals respectively of the power supply circuit, the first and second connection blocks being formed with respective arrays of bores, a first plurality of spring probe pins fitted in the bores in the first connection block, and a second plurality of spring probe pins fitted in the bores in the second connection block.

In accordance with a third aspect of the invention there is provided a power supply assembly comprising a card having first and second opposite sides that are joined by a peripheral edge of the board, the card including an insulating substrate and having first and second conductive layers, at least one power module having first and second terminals connected to the first and second layers respectively of the card, and first and second connection blocks attached to the card at the first and second sides respectively and each including a first portion in contact with the card and a second portion that projects beyond said peripheral edge of the card whereby said second portions of the respective connection blocks are in mutually spaced confronting relationship, and wherein at least one of the connection blocks is configured so that said second portions are substantially closer together than are said first portions

BRIEF DESCRIPTION OF THE DRAWINGS

For a better understanding of the invention, and to show how the same may be carried into effect, reference will now be made, by way of example, to the accompanying drawings, in which.

For convenience and clarity, the following paragraphs describe the test head in a particular orientation. However, this is not intended to imply that the test head may not be used in other orientations or that the claims should be limited to a particular orientation.

DETAILED DESCRIPTION

Figure 1:
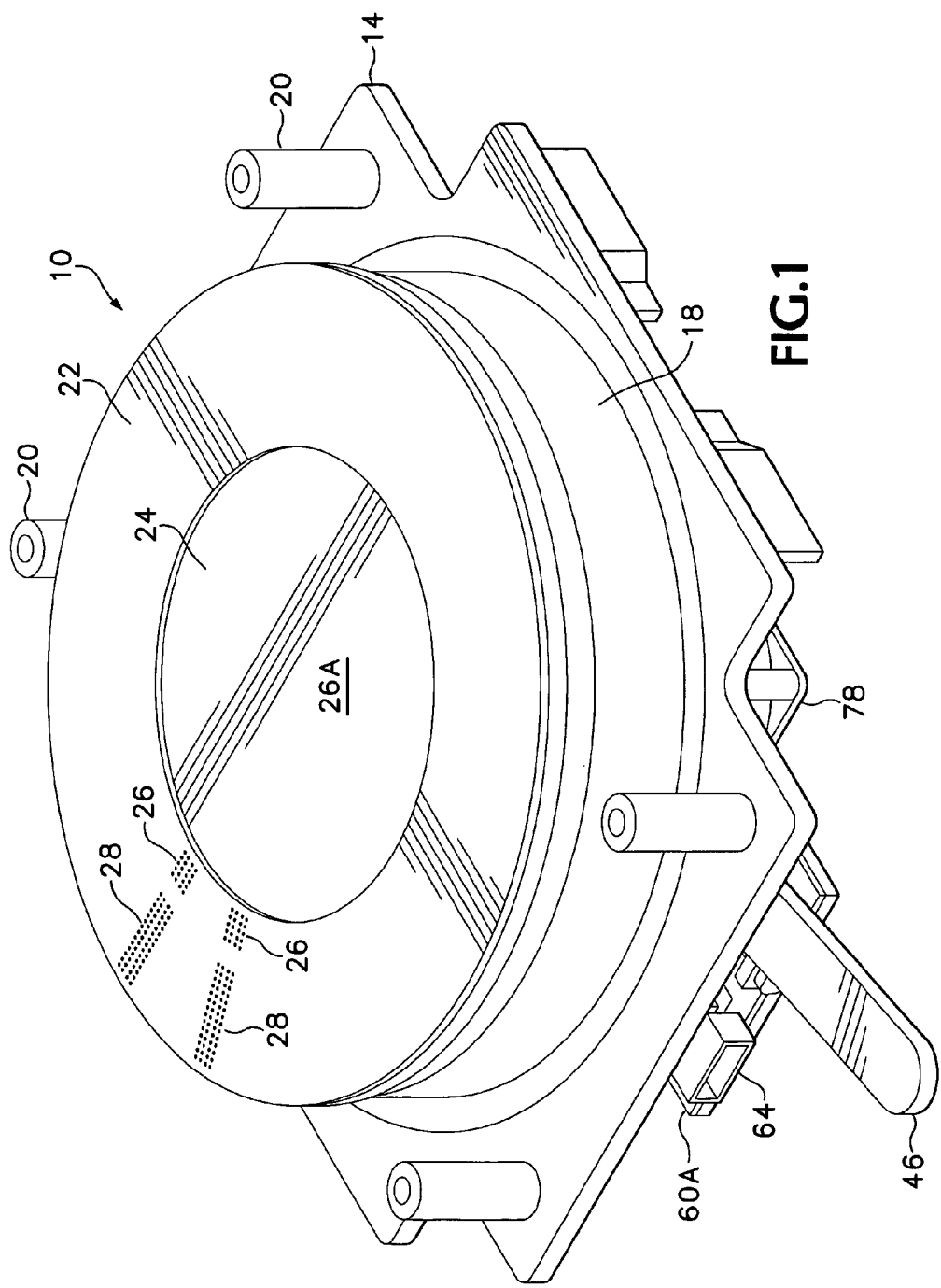
FIG. 1 is a perspective view of a test head embodying the present invention.

FIG. 1 illustrates a test head 10 comprising a main support plate 14 to which a cylindrical outer housing 18 is attached. Alignment pins 20 are secured to the main support plate 14 and are used for docking the test head to failure analysis equipment such as an electron beam probe.

Figure 3:
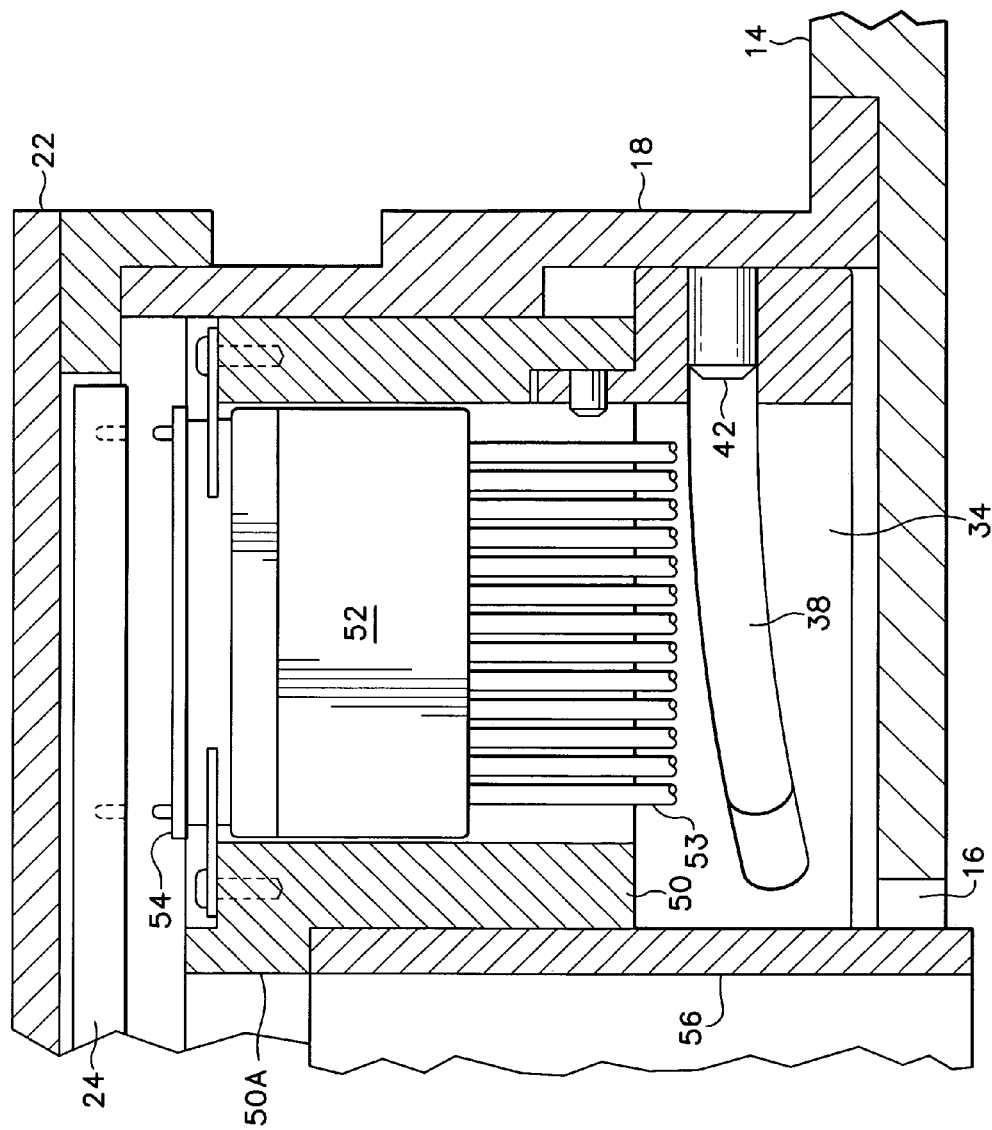
FIG. 3 is an enlarged partial sectional view of the test head.

The main support plate 14 defines a circular opening 16 (FIG. 3). An annular cover plate 22 is attached to the outer housing 18. A circular device interface board (DIB) 24 (see FIG. 3 also) is accommodated within the cylindrical outer housing 18 and has a central region 24A that is exposed through the central opening in the annular cover plate 22. Several DUT sockets (not shown) are attached to the DIB in the central region 24A for receiving respective semiconductor integrated circuit devices under test. Each DUT socket includes power supply pins for supplying operating power to the DUT and signal pins for supplying test signals to, and receiving test signals from, the DUT.

The DIB 24 is formed with two concentric annular arrays of contact elements each comprising a via, the lower end of which is exposed at the underside of the DIB, and an annular contact pad surrounding the lower end of the via. The locations of the contact elements are illustrated schematically in FIG. 1 by the dots on the cover plate 22. The inner annular array of contact elements is composed of sixteen discrete groups 26 of contact elements (the locations of only two groups are shown) in respective sector-shaped regions of the inner array. The contact elements of the inner array include power supply contact elements that are connected through conductive traces of the DIB to the power supply pins of the DUT sockets. The contact elements of the inner array also include control signal contact elements. The outer annular array of contact elements is composed of sixty eight discrete groups 28 of contact elements (the locations of only two groups are shown) in respective sector-shaped regions of the outer array. The contact elements of the outer array are test signal contact elements and are connected through conductive traces of the DIB to the signal pins of the DUT sockets.

Referring to FIG. 3, a cam ring 34 is located above the support plate 14 and within the outer housing 18. The cam ring is coaxial with the outer housing and is formed with multiple helical cam slots 38, only one of which is shown in the drawings. Cam followers 42 attached to the outer housing 18 project radially into the cam slots 38 respectively. The cam ring 34 is attached to a cam operating lever 46 (FIG. 1) that can be actuated to rotate the cam ring relative to the outer housing and thereby raise or lower the cam ring relative to the main support plate 14.

Referring again to FIG. 3, an annular connector support frame 50 is located inside the outer housing 18 and is restrained against rotation within the outer housing 18. The support frame 50 is located in a manner that allows it to move vertically relative to the main support plate 14 and is coupled to the cam ring 34 in a manner that permits relative rotational movement of the cam ring and the support frame but prevents relative vertical movement of the cam ring and the support frame. The support frame 50 defines multiple radial slots that accommodate respective electrical connectors 52, which may be as described in copending patent application Ser. No. 10/802,993 filed Mar. 16, 2004. The mounting of the connectors 52 in the support frame permits a small range of movement of the connectors 52 relative to the support frame 50.

Each connector 52 includes a cable positioning block in which the ends of multiple coaxial cables 53 are held, with the conductive cores of the coaxial cables exposed at the upper surface of the positioning block. Above the cable positioning block is a contact device 54 comprising an insulating member having multiple C-shaped conductive elements accommodated therein.

The DIB 24 is positioned over the support frame 50 and is captive beneath the cover plate 22. Alignment elements (not shown) projecting from the outer housing 18 engage the DIB and thereby position the DIB relative to the outer housing. Alignment pins project upwards from the connectors 52 and are received in alignment bores of the DIB 24, thereby positioning the connectors relative to the DIB, when the support frame is forced upward by actuation of the cam operating lever 46.

Each of the sixty eight groups 28 of contact elements on the lower surface of the DIB 24 corresponds to one of the connectors 52, and the pattern of contact elements in each group 28 matches the pattern of the conductive cores of the coaxial cables 53 held by the corresponding connector. When the frame 50 is forced upward relative to the main support plate 14 by actuation of the lever 46, the C-shaped conductive elements of the contact device 54 provide electrical connections between the coaxial cables and respective pads on the underside of the DIB 24.

Figure 2:
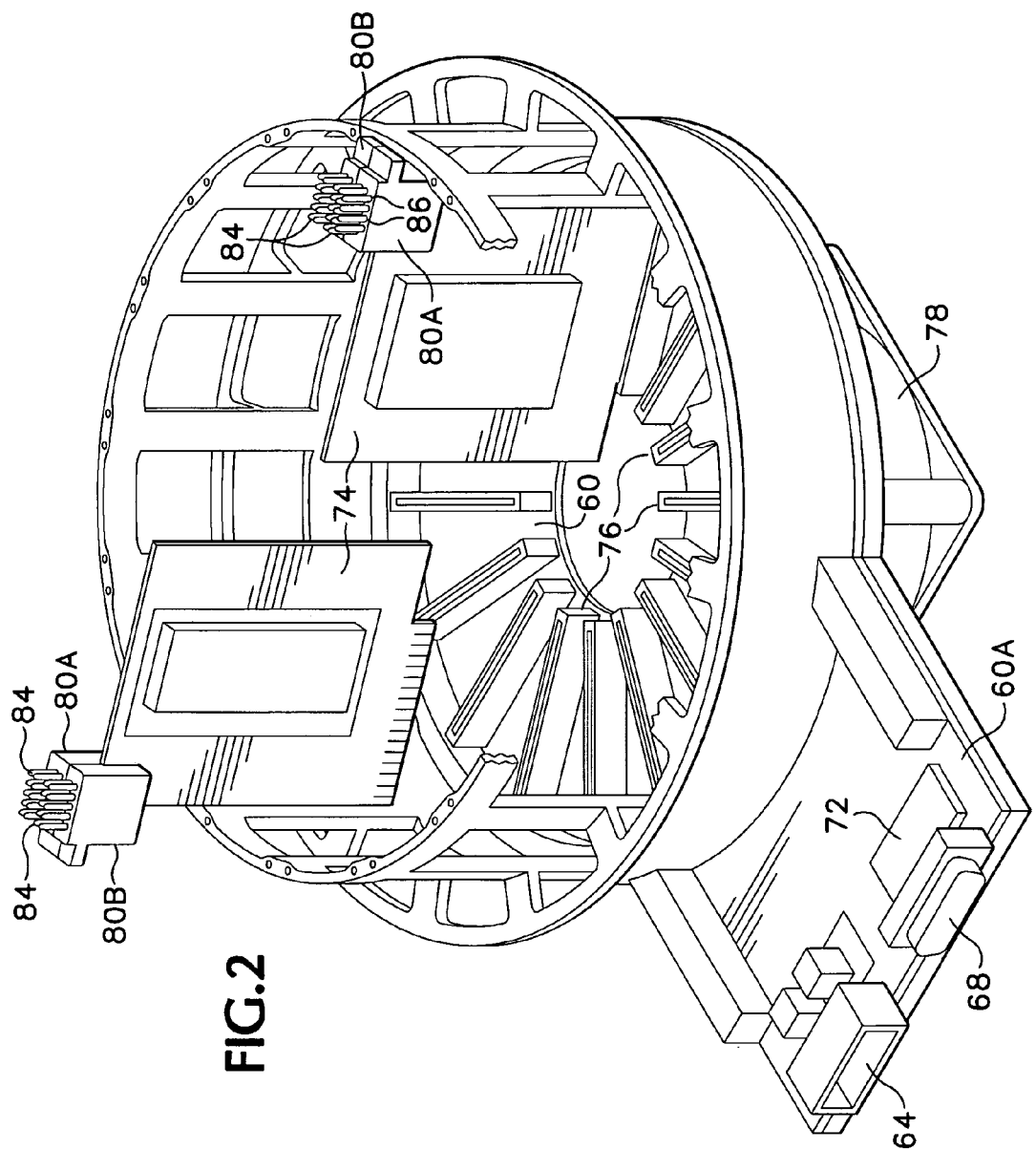
FIG. 2 is a partial perspective view of the test head and shows a power distribution board and power module cards.

At its upper end, the support frame 50 has an internal flange or lip 50A (FIG. 3). A generally cylindrical inner frame 56 is attached at its upper end to the flange 50A of the support frame 50 and extends downward from the support frame through the circular opening 16 of the main support plate 14. The inner frame 56 is attached at its lower end to a generally annular power distribution board 60 (FIG. 2). Thus, the power distribution board is coupled to the support frame 50 by the inner frame 56 and moves vertically relative to the main support plate when actuation of the cam operating lever 46 raises and lowers the support frame.

The power distribution board 60 has a generally rectangular extension 60A, which can be seen in FIGS. 1 and 2. The power distribution board extension 60A is provided with a power connector 64 and a control connector 68. In an alternative implementation, there are two diametrically opposed extensions and one extension is provided with the power connector and the other is provided with the control connector. When the test head is in use, terminals of the power connector 64 are connected to a source of unregulated DC power that provides, for example, +12V, +48V and +5V. A power supply FPGA controller 72 is mounted on the extension 60A and has terminals connected to pins of the control connector 68.

Sixteen power supply connectors 76 are attached to the upper surface of the power distribution board 60. The connectors 76 extend radially of the board 60 and are equiangularly distributed about the center of the power distribution board 60. Each connector 76 has power supply pins that are connected to the terminals of the power connector 64 and has control pins that are connected to terminals of the power supply controller 72.

A fan 78 is positioned below the power distribution board 60 and induces a flow of cooling air through the central opening in the power distribution board.

Up to sixteen power module cards 74 are fitted in the connectors 76 respectively, each power module card being disposed in a vertical orientation and being generally rectangular except for an extension 90 (FIGS. 5-6) at its upper edge. The extension is provided with electrically conductive layers 92A, 92B on the two opposite sides of the extension.

Figure 4:
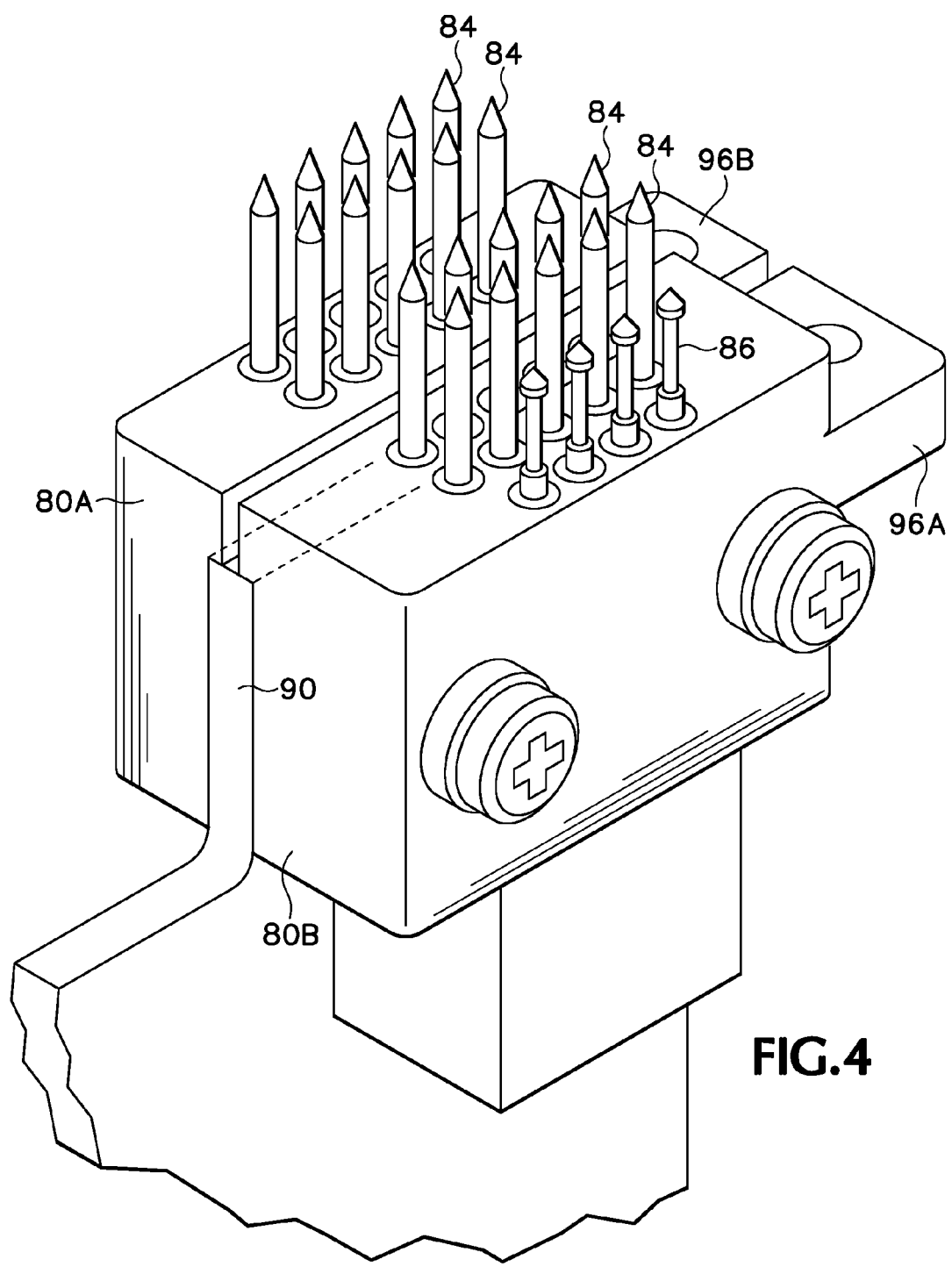
FIG. 4 is an enlarged perspective view of an upper end region of a power module card, and shows two connection blocks and spring probe pins inscalled in the conneccion blocks.
Figure 5:
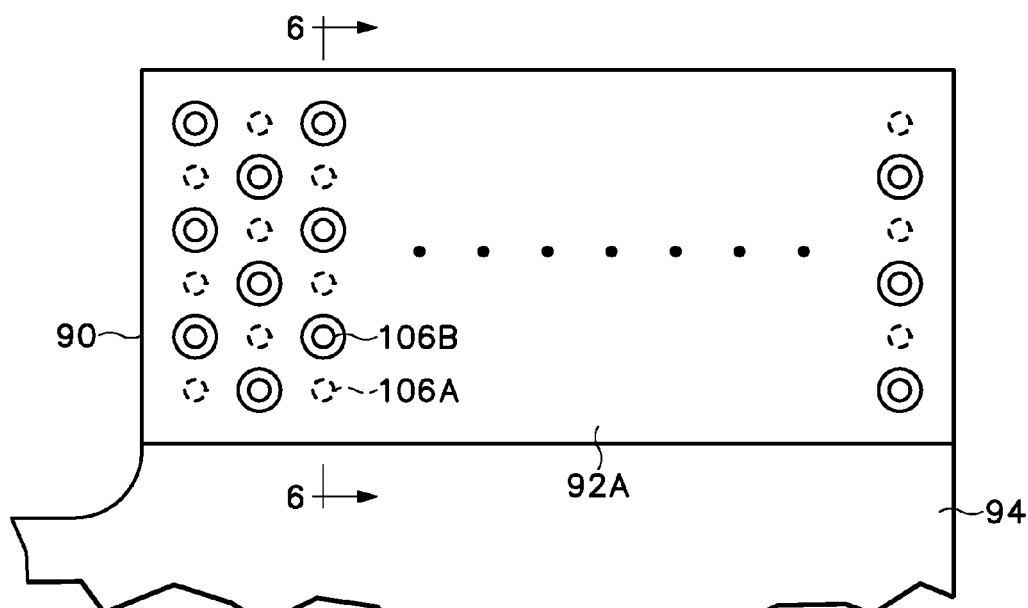
FIG. 5 is an enlarged partial elevation of one of the power module cards with the connection blocks removed.
Figure 6:
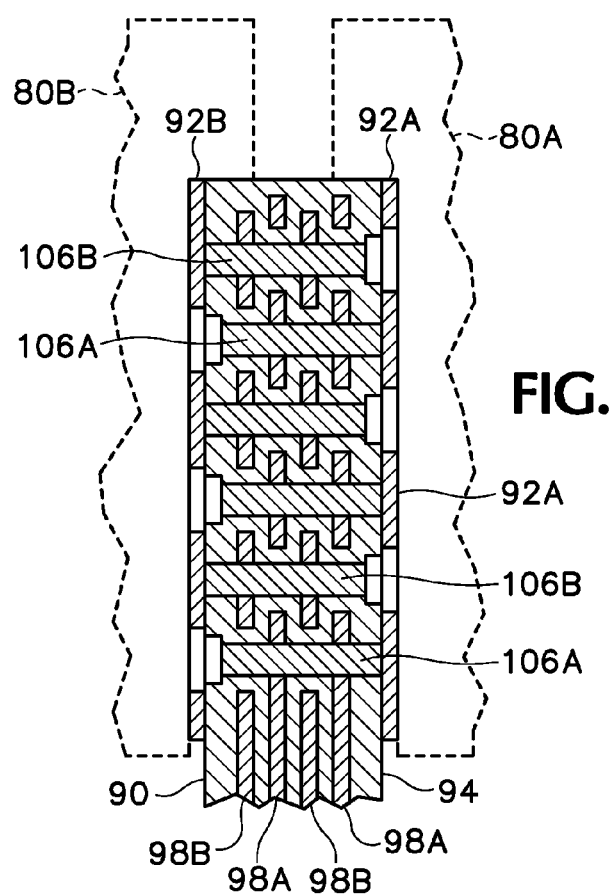
FIG. 6 is an enlarged partial sectional view of one of the power module cards.
Figure 7:
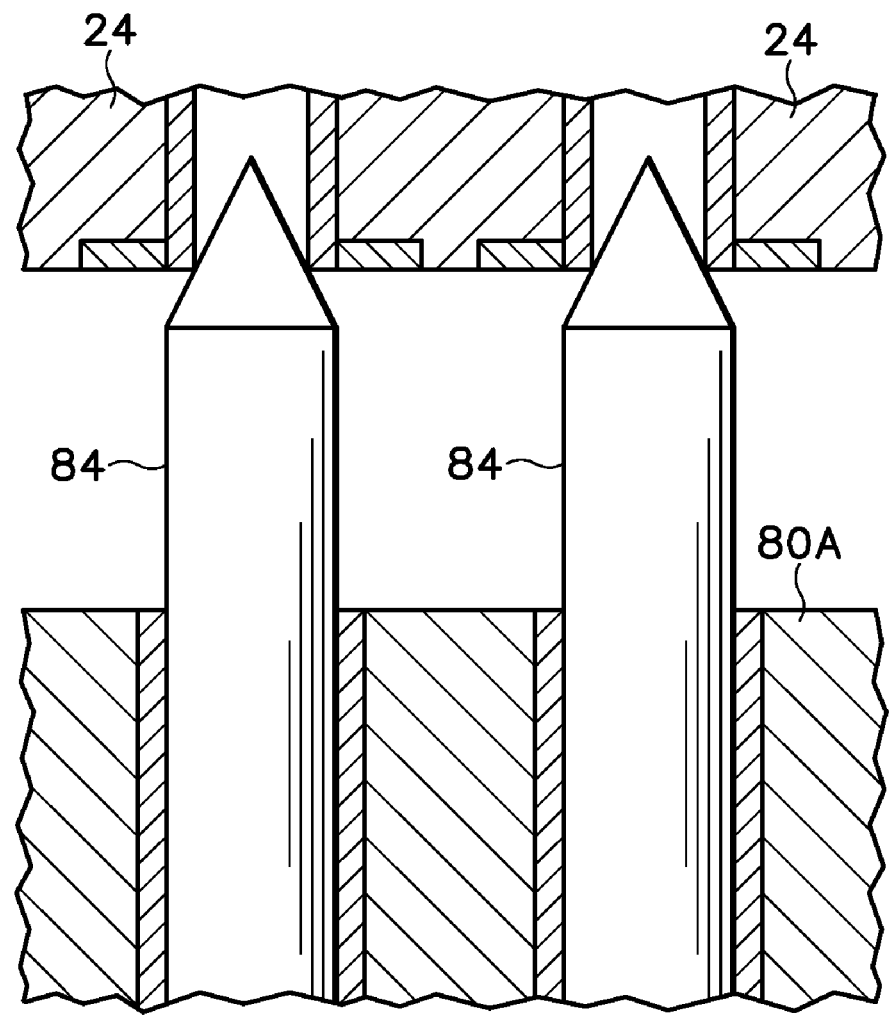
FIG. 7 is a cross-sectional view of the spring probe pins installed in the connection block mating with hollow vias exposed on the surface of a DIB.

Referring to FIGS. 4-6, two electrically conductive connection blocks 80A, 80B are attached to each power module card 74 at opposite respective sides of the extension 90 at the upper edge of the power module card. The two connection blocks 80A, 80B are secured to the extension by screws that are insulated from the block 80A by insulating sleeves and are in threaded engagement with the block 80B. The two blocks 80A and 80B are aligned relative to the power module card by insulating alignment pins (not shown) that fit in alignment bores of the two blocks. The connection blocks 80A, 80B are in electrically conductive pressure contact with the conductive layers 92A, 92B respectively and are electrically insulated from each other.

Each connection block 80 incorporates multiple spring probe pins 84. Each spring probe pin 84 comprises a metal barrel, a metal plunger fitted in the barrel, and a metal compression spring held in the barrel and forcing the plunger upward relative to the barrel. The metal barrels of the spring probe pins 84 are fitted directly in the respective connection blocks and accordingly the plunger of each pin 84 is electrically connected to the connection block in which the particular pin is mounted.

The connection block 80A incorporates several additional spring probe pins 86. The barrels of the spring probe pins 86 are mounted in the connection block 80A using insulating sleeves, and accordingly the plungers of the pins 86 are insulated from the connection block. The barrels of the spring probe pins 86 extend downward beyond the connection block 80A and are protected by a detachable shroud.

The connection blocks 80A, 80B have respective flanges 96A, 96B (FIG. 4) that extend over the internal flange 50A of the support frame 50 (not shown in FIG. 2) and are each formed with an alignment bore that receives an alignment pin projecting upward from the internal flange 50A, thereby holding the connection blocks in position relative to the support frame.

Referring to FIGS. 5 and 6, each power module card comprises a dielectric substrate 94, multiple force layers 98A, multiple return layers 98B and a signal layer (not shown). Two power modules, as described in U.S. patent application Ser. No. 10/458,342, are attached to the dielectric substrate at opposite respective sides thereof. Each power module includes a DC/DC converter and has force and return terminals that are connected to the force and return layers respectively of the power module card. It will be assumed in the following description that the DC/DC converter operates in a mode such that the force terminal of the power module is at a positive potential relative to the return terminal, but it will be understood that in other cases the force terminal may be at a negative potential relative to the return terminal.

Vias 106A in the extension 90 of the power module card connect the force layers 98A to the conductive layer 92A on one side of the extension, and vias 106B connect the return layers 98B to the conductive layer 92B at the opposite side of the extension. The vias 106A are distributed in a rectangular array at equal horizontal and vertical spacings S and the vias 106B are similarly distributed. The two rectangular arrays of vias are offset from each other horizontally and vertically by S/2 so that the two arrays collectively form a rectangular array at equal horizontal and vertical spacings S/2.

As mentioned in patent application Ser. No. 10/458,342, each power module includes control circuits that implement several control functions, such as voltage measurement and adjustment, enabling of the DC/DC converters, and load sharing. Each power module has positive voltage sense, negative voltage sense, load share and group enable terminals connected to the control circuits. Signals that are used in performing the control functions are conveyed between the power modules and the power supply controller 72 by the connector 76 and conductive traces of the power distribution board 60.

The signal layer of the power module card includes four discrete control traces that are connected to the positive voltage sense, negative voltage sense, load share, and group enable terminals respectively of the two power modules. The control traces are connected to respective terminals in a signal connector terminal block (not shown) that is attached to the power module card. The terminals of the signal connector terminal block are connected by suitable wires (not shown) to the plungers of the spring probe pins 86 respectively.

Each of the sixteen groups 26 of contact elements on the lower surface of the DIB 24 corresponds to one pair of connection blocks 80A, 80B, and the pattern of contact elements in each group 26 matches the pattern of the spring probe pins mounted in the corresponding pair of connection blocks. Accordingly, when the cam operating lever is actuated to rotate the cam ring 34 in the sense to raise the frame 50 so that the contact device 54 establishes electrical connection between the connectors 52 and the contact elements of the corresponding group 28, the pins 84, 86 engage respective contact elements in the corresponding group 26. Preferably, the vias of the contact elements are hollow and the spring probe pins 84, 86 have sharp conical tips that enter the lower ends of the hollow vias. The spring probe pins contact the rims of the vias, thus providing a relatively large contact area and reducing the contact resistance between the pins and the contact elements. When the support frame 50 is in its lower position, the spring probe pins 84 and 86 are spaced from the DIB 24.

The conductive traces of the DIB 24 provide several control buses (not shown). The number of control buses is equal to the number of spring probe pins 86 in each connection block 80A. The contact elements that are engaged by the four spring probe pins 86 of a given connection block 80A are connected to different respective control buses. Two of the control buses are sense buses that provide signals reflecting current operating conditions of the DIB and are connected by respective pins 86 and control traces of the power module card to the positive and negative voltage sense terminals of the power modules. The other two control buses are a group enable bus and a load share bus and are connected by the other two pins 86 and control traces of the power module card to the group enable and load share terminals respectively of the power modules. The group enable bus and load share bus convey analog signals that are used to support particular functions of the power modules, as described in detail in patent application Ser. No. 10/458, 342. It will be appreciated that the number of control buses, and correspondingly the number of pins 86 in each connection block 80A, depends on the number of power module control functions that are utilized in the particular implementation, and that this number may be less than four or greater than four.

The contact elements that are engaged by the spring probe pins 84 mounted in the connection block 80A are connected to a power bus of the DIB and the contact elements that are engaged by the spring probe pins 84 mounted in the connection block 80B are connected to a ground bus of the DIB. The power and ground buses of the DIB are connected to the power supply pins of the DUT sockets. The two sense buses are connected to the power and ground buses respectively.

The force layers 98A, vias 106A, connection block 80A and the spring probe pins 84 installed in the block 80A form respective segments of a force rail of the power modules of the power module card, and similarly the return layers 98B, vias 106B, connection block 80B and the spring probe pins 84 installed in the block 80B form respective segments of a return rail of the power module card.

The power modules of each power module card provide regulated DC voltage to the force and return rails, which are connected to the power supply terminals of the DUT by the power and ground buses of the DIB. Because the power module cards are close to the DIB, the conductive paths between the force and return terminals of the power modules and the power and ground terminals of the DUT are short. In addition, the force and return layers of the power module card are connected to the connection blocks 80A, 80B by multiple vias, and each connection block is connected to the respective power supply bus of the DIB by multiple spring probe pins 84 and multiple contact elements. These measures result in the power paths from the power modules to the power and ground buses of the DIB having a low equivalent series resistance (ESR). It is desirable that the ESR be low so that any change in the voltage drop between the terminals of the power modules and the terminals of the DUT due to change in current supplied to the DUT will be small and the voltage difference between the power and ground terminals of the DUT can be controlled within narrow limits. The use of multiple vias and multiple spring probe pins also results in the power paths having a low equivalent series inductance (ESL). It is desirable that the equivalent series inductance be low in order to minimize power supply voltage transients that occur when the current supplied to the DUT changes and, correspondingly, minimize the size of the regulating capacitors that might be needed in order to reduce the power supply voltage transients. Although it would be possible to use a single force layer and a single return layer, multiple force and return layers are preferred because this also reduces ESR and ESL, and the multiplicity of layers increases capacitive coupling of the layers.

As shown in FIG. 6, the two connection blocks are configured so that each of them extends above the upper edge of the power module card and the regions of the connection blocks that extend above the power module card are at a spacing that is large enough to ensure electrical insulation of the connection blocks but is nevertheless substantially smaller than the thickness of the power module card. This feature also assists in precise positioning of the connection blocks relative to the power module card.

The relatively large confronting areas of the connection blocks and the small spacing between the upper regions of the connection blocks results in a relatively large capacitance between the force and return rails of the power module card. Further, the configuration of the two arrays of vias also contributes to capacitance between the force and return rails. Accordingly, in an embodiment of the invention it is possible to provide a sufficiently clean power supply without need for additional regulating capacitors connected between the force and return rails.

Conventionally, the barrel of a spring probe pin is housed in a receptacle that is supplied by the manufacturer of the pin. Use of such a receptacle would facilitate connection of the plunger of the pin to the connection block and removal of a defective pin. However, this advantage is provided at the cost of a rather large contact resistance between the barrel and the receptacle. A high contact resistance is particularly undesirable in the case of the spring probe pins 84, because they are in the power supply path for the DUT. In order to avoid the high contact resistance, the barrels of the spring probe pins are press fitted directly in tight tolerance bores in the connection blocks, without use of receptacles. This measure may be considered undesirable from the viewpoint of cost in machining the connection blocks and difficulty in repairing a connection block with a defective pin, but these disadvantages are offset by the reduction in resistance of the power supply path.

The barrels of most conventional spring probe pins are of uniform cylindrical construction, and the plunger is biased into contact with the barrel to provide an electrical connection between the barrel and the plunger. Preferably, the spring probe pins that are used in an embodiment of the invention have so-called bifurcated barrels, i.e. the barrel is split longitudinally at its end into two or more parts and at least one part is deflected inwards and bears against the plunger. This bifurcation feature reduces contact resistance between the plunger and the barrel as compared to other conventional spring probe pins.

It will be appreciated that the invention is not restricted to the particular embodiment that has been described, and that variations may be made therein without departing from the scope of the invention as defined in the appended claims and equivalents thereof. For example, although the power modules in the illustrated embodiment include control circuits for voltage sense, group enable and load share, in another embodiment the power modules may include more control circuits or fewer control circuits, depending on the functions that are supported by the power modules. In addition, although the force and return rails of the power modules are connected to the power and ground buses respectively of the DIB, in another embodiment a polarity reversing switch might be provided on the DIB in order to support a test in which the force and return rails are connected to the ground and power buses respectively. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. Further, a reference in the foregoing description to an element, be it a reference to one instance of that element or more than one instance, is not intended to imply that any claim should be interpreted as if it required that element or that embodiments of the invention could not be implemented without that element.

The invention claimed is:

1. A power supply assembly comprising:
   a dielectric substrate having first and second opposite main surfaces,
   a power supply circuit supported by the dielectric substrate and having first and second power supply terminals,
   a first conductive connection block attached to the dielectric substrate at the first main surface thereof and connected to the first power supply terminal of the power supply circuit, the first connection block being formed with a bore, and
   a spring probe pin fitted in the bore formed in the connection block,
   and wherein the spring probe pin includes a conductive sleeve and a conductive plunger fitted in the sleeve and the conductive sleeve is in electrically conductive contact with the first connection block.

2. An assembly according to claim 1, wherein the bore is a precision bore in the connection block, and the conductive sleeve of the spring probe pin is press fit in the precision bore in direct electrically conductive contact with the connection block.

3. An assembly according to claim 1, wherein the sleeve of the spring probe pin is split longitudinally into at least two parts and at least one part of the sleeve is deflected into pressure contact with the plunger.

4. An assembly according to claim 1, wherein the conductive plunger has a conical tip.

5. An assembly according to claim 1, comprising a conductive power supply layer supported by the dielectric substrate and connected to the first power supply terminal of the power supply circuit, and conductive elements connecting the power supply layer to the first connection block.

6. An assembly according to claim 1, comprising first and second conductive power supply layers supported by the dielectric substrate and connected to the first and second power supply terminals respectively of the power supply circuit, first and second surface layers of conducive material adhered to the dielectric substrate at the first and second main surfaces thereof, a first array of conductive elements connecting the first power supply layer to the first surface layer of conductive material, and a second array of conductive elements connecting the second power supply layer to the second surface layer of conductive material, and wherein the first connection block is in electrically conductive contact with the first surface layer and the assembly further comprises a second conductive connection block in electrically conductive contact with the second surface layer.

7. An assembly according to claim 6, comprising a fastening element that passes through the dielectric substrate and secures the first and second connection blocks in contact with the first and second surface layers respectively.

8. An assembly according to claim 6, wherein the dielectric substrate is formed with first and second interdigitaced arrays of apertures and the first and second arrays of conductive elements are located in the first and second arrays of apertures respectively.

9. An assembly according to claim 8, wherein the first and second arrays of apertures are interdigitated in checkerboard fashion.

10. An assembly according to claim 6, wherein the first and second connection blocks are located adjacent a peripheral edge of the dielectric substrate, each connection block includes a contact portion and a projection portion, the contact portions of the first and second connection blocks have respective faces in contact with the first and second surface layers, and the projection portions of the first and second connection blocks project beyond said peripheral edge and have respective faces that are in mutually spaced parallel confronting relationship.

11. An assembly according to claim 10, wherein said faces of the projection portions of the connection blocks are at a smaller spacing than said faces of the contact portions of the connection blocks.

12. An assembly according to claim 1, wherein the first connection block is formed with a plurality of parallel bores and the assembly comprises a plurality of spring probe pins fitted in the bores respectively.

13. An assembly according to claim 1, wherein the power supply circuit has an ancillary terminal and the assembly includes an ancillary spring probe pin fitted in a bore in the first connection block and connected to the ancillary terminal.

14. An assembly according to claim 13, wherein the ancillary terminal of the power supply circuit is a sense terminal.

15. An assembly according to claim 13, wherein the ancillary terminal of the power supply circuit is a control terminal.

16. A power supply assembly comprising:
   a dielectric substrate having first and second opposite main surfaces,
   a power supply circuit supported by the dielectric substrate and having first and second power supply terminals,
   first and second conductive connection blocks actached to the dielectric substrate at the first and second main surfaces respectively and connected to the first and second power supply terminals respectively of the power supply circuit, the first and second connection blocks being formed with respective arrays of bores,
   a first plurality of spring probe pins fitted in the bores in the first connection block, and
   a second plurality of spring probe pins fitted in the bores in the second connection block.

17. An assembly according to claim 16, comprising first and second conductive power supply layers supported by the dielectric substrate and connected to the first and second power supply terminals respectively of the power supply circuit, first and second surface layers of conductive material adhered to the dielectric substrate at the first and second main surfaces thereof, a first array of conductive elements connecting the first power supply layer to the first surface layer of conductive material, and a second array of conductive elements connecting the second power supply layer to the second surface layer of conductive material, and wherein the first and second connection blocks are in electrically conductive contact with the first and second surface layers respectively.

18. An assembly according to claim 17, comprising a fastening element that passes through the dielectric substrate and secures the first and second connection blocks in contact with the first and second surface layers respectively.

19. An assembly according to claim 17, wherein the dielectric substrate is formed with first and second interdigitated arrays of apertures and the first and second arrays of conductive elements are located in the first and second arrays of apertures respectively.

20. An assembly according to claim 17, wherein the first and second connection blocks are located adjacent a peripheral edge of the dielectric substrate, each connection block includes a contact portion and a projection portion, the contact portions of the first and second connection blocks have respective faces in contact with the first and second surface layers, and the projection portions of the first and second connection blocks project beyond said peripheral edge and have respective faces that are in mutually spaced parallel confronting relationship.

21. An assembly according to claim 20, wherein said faces of the projection portions of the connection blocks are at a smaller spacing than said faces of the contact portions of the connection blocks.

22. An assembly according to claim 16, wherein each of the spring probe pins includes a bifurcated conductive sleeve and a conductive plunger fitted in the sleeve and the conductive sleeve is in electrically conductive contact with the connection block in which the spring probe pin is precisely fitted.

23. A power supply assembly comprising:
a card having first and second opposite sides that are joined by a peripheral edge of the card, the card including an insulating substrate and having first and second conductive layers,
at least one power module having first and second terminals connected to the first and second layers respectively of the card, and
first and second connection blocks attached to the card at the first and second sides respectively and each including a first portion in contact with the card and a second portion that projects beyond said peripheral edge of the card whereby said second portions of the respective connection blocks are in mutually spaced confronting relationship,
and wherein at least one of the connection blocks is configured
so that said second portions are substantially closer together than are said first portions.

24. A power supply assembly according to claim 1, wherein the power supply circuit includes circuitry for providing a regulated DC voltage between the first and second power supply terminals.

25. A power supply assembly according to claim 1, wherein the conductive sleeve has an opening and the spring probe pin includes a spring element within the conductive sleeve for forcing the conductive plunger out of the opening.

26. A power supply assembly comprising:
a dielectric substrate having first and second opposite main surfaces,
a power supply circuit supported by the dielectric substrate and having first and second power supply terminals,
a first conductive connection block attached to the dielectric substrate at the first main surface thereof and connected to the first power supply terminal of the power supply circuit, the first connection block being formed with a bore,
a spring probe pin fitted in the bore formed in the connection block, the spring probe pin including a conductive sleeve and a conductive plunger fitted in the sleeve, the conductive sleeve being in electrically conductive contact with the first connection block,
a conductive power supply layer supported by the dielectric substrate and connected to the first power supply terminal of the power supply circuit,
conductive elements connecting the power supply layer to the first connection block, and
a layer of conductive material adhered to the dielectric substrate at the first main surface thereof,
and wherein the first connection block is in electrically conductive contact with the layer of conductive material and said conductive elements are electrically connected both to the power supply layer and to said layers of conductive material.

27. An assembly according to claim 26, comprising multiple conductive power supply layers connected to the first power supply terminal, and wherein said conductive elements are connected both to said multiple power supply layers and to said layer of conductive material.

28. A power supply assembly for connecting an electrical power source to a target device when the target device is electrically connected to a current path of an interface board, the assembly comprising:
a hollow conductive via in the interface board, the via being electrically connected to the current path and having an exposed lower end, the lower end having an inner perimeter rim defining an opening,
a connection block formed with a bore, and
a spring probe pin fitted in the bore and including:
a sleeve having an open end,
a conductive plunger located at least partially within the sleeve, electrically connected to the power supply, and having a tapered tip, the tapered tip having a surface directed away from the connection block, and
a spring element within the sleeve for urging the plunger from the sleeve's open end, and
wherein the via and the plunger are configured so that when the connection block and the interface board are brought together the tapered tip of the plunger enters the opening and the surface of the tapered tip contacts the inner perimeter rim.

29. An assembly according to claim 28, wherein the via's opening is circular and the plunger's tip is conical.

* * * * *